(12) United States Patent
Emberling et al.

(10) Patent No.: US 6,781,406 B2
(45) Date of Patent: Aug. 24, 2004

(54) USING OBSERVABILITY LOGIC FOR REAL-TIME DEBUGGING OF ASICS

(75) Inventors: Brian D. Emberling, San Mateo, CA (US); Ewa M. Kubalska, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 128 days.

(21) Appl. No.: 10/090,481

(22) Filed: Mar. 4, 2002

(65) Prior Publication Data

US 2003/0164718 A1 Sep. 4, 2003

(51) Int. Cl.[7] .......................................... H03K 19/173
(52) U.S. Cl. ........................................ 326/38; 326/16
(58) Field of Search ............................. 326/16, 38–41

(56) References Cited

U.S. PATENT DOCUMENTS

| | | | |
|---|---|---|---|
| 5,005,173 A | | 4/1991 | Martin |
| 5,717,695 A | * | 2/1998 | Manela et al. ............. 714/718 |
| 6,034,544 A | * | 3/2000 | Agrawal et al. ............ 326/39 |
| 6,101,457 A | | 8/2000 | Barch et al. |
| 6,467,009 B1 | | 10/2002 | Winegarden et al. |
| 6,492,798 B2 | * | 12/2002 | Sunter ..................... 324/76.15 |
| 2002/0175699 A1 | * | 11/2002 | Kohno ....................... 326/16 |

* cited by examiner

*Primary Examiner*—Don Le
(74) *Attorney, Agent, or Firm*—Meyertons Hood Kivlin Kowert & Goetzel, P.C.; Jeffrey C. Hood

(57) ABSTRACT

An integrated circuit including logic for testing internal operation of the integrated circuit. The integrated circuit may comprise a plurality of internal functional blocks coupled by a plurality of internal buses. The integrated circuit may also comprise a set of test control input pins and a set of test output pins comprised on the integrated circuit. The integrated circuit may comprise selection logic. The selection logic comprises inputs coupled to various ones of the internal buses, an output coupled to the set of test output pins, and a select input coupled to receive select signals from the set of test control input pins. The selection logic is operable to select internal bus signals from an internal bus based on the select signals from the test control input pins, and the selection logic is configured to output the selected internal bus signals to the set of test output pins. The integrated circuit thus allows multiplexing of different critical internal buses so that the signals on the critical buses may be output for observation via selected test pins on the integrated circuit. The observability logic may be configured to switch slowly relative to the internal busses, and the generation of the observability logic and testing may be automated.

15 Claims, 6 Drawing Sheets

USING OBSERVABILITY LOGIC FOR REAL-TIME DEBUGGING OF ASICS

BACKGROUND OF THE INVENTION

1. Field of the Invention

The present invention generally relates to testing of integrated circuits, and more particularly, to the debugging of complex application specific integrated circuits (ASICs).

2. Description of the Related Art

Many modern electronic devices are now implemented using application specific integrated circuits (ASICs). ASICs are computer chips designed for a specific application, and are typically built by connecting existing circuit building blocks. Since the building blocks may already exist in a library, it is much easier to produce a new ASIC than to design a new chip from scratch. As the feature size of integrated circuits has grown smaller, the level of integration (i.e., the number of gates) available in ASICs has grown. With this increase has come increased complexity in all stages of the integrated circuit (IC) design process, particularly the testing phase.

Testing ASICs means more than just designing for test. Although today's sophisticated design-for-test (DFT) tools are a big step forward from earlier ones, testing is still a difficult process. One area of particular concern is trying to make sure that the devices will be testable when the silicon finally arrives. For complex designs this requires much more than just the utilization of an automatic-test pattern-generation (ATPG) package. Even with these automated tools, test-development can still take months and, in the case of mixed-signal ICs, sometimes stretches to over a year.

Very complicated ASICs (e.g., those with over a million gates), are particularly difficult to debug. This problem is exacerbated when the test is performed when the ASIC is in a system. The potential errors can be hard to identify due to the very low visibility into the chip. One prior art solution to this problem is functional, or edge-connector test. In this test a system board is coupled to test hardware (e.g., a programmable test computer), that applies particular input to the board and then monitors the board's output to see if the expected results are obtained. This method has a number of drawbacks. First, the test code must generally be manually written. Also, the test code may be slow, depending on how long it takes to get the board set up to the particular test state. Furthermore, the testing is based on the board function, not the underlying circuit structure. Finally, the testing is typically limited to input/output (I/O) only, since only I/O ports are visible with this method.

A second prior art solution is a so-called in-circuit test using a bed-of-nails tester. A bed-of-nails-tester uses expensive testers and fixtures that physically connect to test points on a board. While this method gives better test resolution than the edge-connector test, it too has a number of limitations. First is the high cost of having custom fixtures made. Second, some modern boards are difficult to test with these testers (e.g., double-sided boards, those with fine lead pitch devices). Finally, the tests are still limited to the device stage (i.e., there is no way to see inside a complex ASIC).

In order to address a number of these drawbacks, a third solution called boundary scan technology was developed. ICs designed to support boundary scan functionality typically include a set of control and data pins which allow test data and results to be shifted into and out of the device. The test paths within the devices allow certain registers to be preloaded with test patterns, and then the device can be clocked and the results shifted out. One organization, the Joint Test Action Group (JTAG) developed a standard for boundary scan technology in the mid 1980's (now IEEE Std. 1149.1).

While JTAG provides a substantial improvement over other prior art test methods, it still does not satisfy all test needs, particularly for highly complex high-speed ASICs. In particular, it is difficult to monitor in real-time the inner workings of an ASIC being tested because the boundary scan methodology typically utilizes a serial shift out of test data on the ASIC's own output pins. In addition, there are no provisions for allowing direct real time access to wide internal buses deep within the ASIC. For these reasons, a system and method for allowing real time observability into complex ASICs is needed.

SUMMARY OF THE INVENTION

The problems outlined above may at least in part be overcome by a system and method for testing integrated circuits in accordance with the present invention. In one embodiment, such a system and method utilize special logic that allows the multiplexing of different critical busses so that the signals on the critical busses may be output for observation via selected test pins on the integrated circuit. Unlike prior art boundary scan devices, the information from the selected critical bus may be output in parallel in real time. Advantageously, this may make testing and/or debugging the integrated circuit design more accurate and less time consuming.

In one embodiment, an integrated circuit utilizing the system for testing may include a plurality of functional units connected by a plurality of internal buses. The integrated circuit may include a plurality of pins ("functional pins"), typically located on the periphery of the integrated circuit, used for interfacing with other integrated circuits or devices. In order to enable efficient and accurate testing and debugging of the functional blocks, it may be advantageous to be able to monitor signals on some or all of the internal busses connecting some or all of the functional units. To accomplish this, the integrated circuit may also include one or more control pins and/or test pins, also typically located on the periphery of the integrated circuit, used for debugging the ASIC. The integrated circuit may also include multiplexing logic comprised in the integrated circuit and connected to some or all of the internal buses and/or functional units. The multiplexing logic may be configured to select one of the internal buses or functional units in response to one or more control signals conveyed to the multiplexing logic via the control pins. The multiplexing logic may be configured to output signals from the selected internal bus or functional unit to the test pins in real-time and preferably in parallel.

In some implementations, the multiplexing logic may be configured to switch slowly relative to the internal buses and/or functional units. Advantageously, this may allow the multiplexing logic to be implemented on the integrated circuit using smaller transistors, thereby preserving precious real estate on the die.

A method for testing integrated circuits is also contemplated. In one embodiment, the method includes conveying one or more control signals to one or more test control pins on an integrated circuit that is to be tested. The control signal or signals cause the selection logic within the integrated circuit to select one of a plurality of internal buses and/or functional units for output to a set of parallel output pins on the integrated circuit. Software for automatically determining the size of multiplexing logic to allow a particular set of internal buses and/or states to be individually monitored is also contemplated. Software for performing automated testing of the integrated circuit using the methods described herein is also contemplated.

BRIEF DESCRIPTION OF THE FIGURES

The foregoing, as well as other objects, features, and advantages of this invention may be more completely understood by reference to the following detailed description when read together with the accompanying drawings in which.

Figure 1:
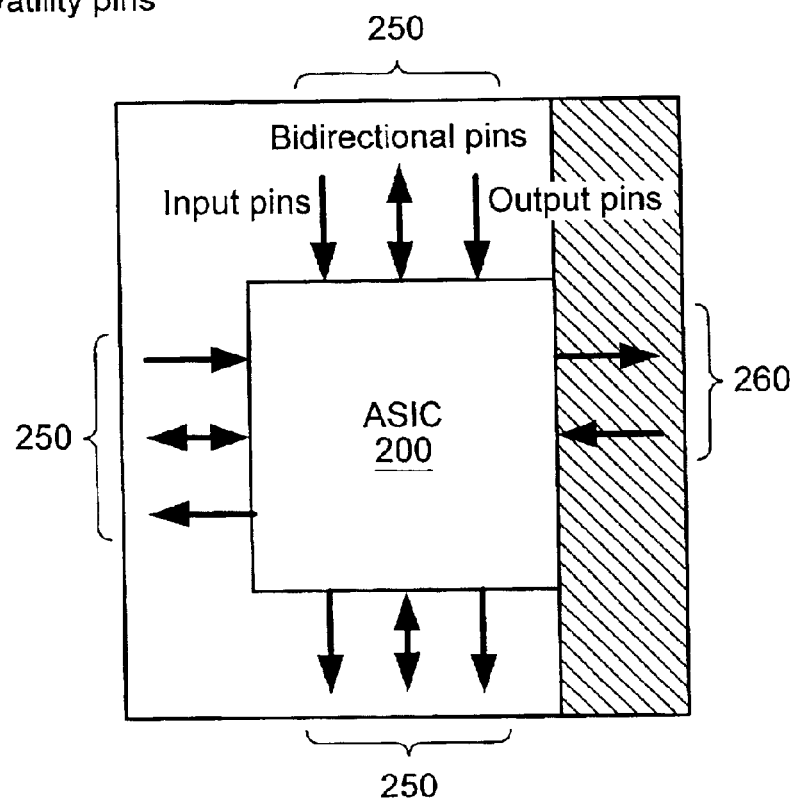
FIG. 1 illustrates the integrated circuit, including the functional pins and the observability pins of the integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). As used herein, the terms "connected" and "coupled" mean connected, directly or indirectly.

DETAILED DESCRIPTION OF THE EMBODIMENTS

FIG. 1—Integrated Circuit

FIG. 1 illustrates an integrated circuit 200 which includes logic (referred to as "observability logic") for testing the integrated circuit according to one embodiment of the present invention. The integrated circuit 200 may be an application specific integrated circuit (ASIC). The integrated circuit 200 may be configured to perform any of various functions. For example, the integrated circuit 200 may be a processor or CPU, a graphics processor, a network processor, an I/O interface, or other type of integrated circuit.

As shown, the integrated circuit 200 may include a plurality of pins 250 and 260 for interfacing with other integrated circuits or devices, i.e., for interfacing with the external world. As shown, the pins 250 and 260 are typically located on the periphery of the integrated circuit 200.

A plurality of the pins may be referred to as functional pins 250. The functional pins 250 provide input/output operations for operation of the integrated circuit 200. In other words, the functional pins 250 are related to the function or operations performed by the integrated circuit 200, and are not specifically related to testing or observability functions (although they may be used in testing the integrated circuit 200).

As shown, the integrated circuit 200 may also include one or more observability pins 260. The observability pins 260 are used for observing or testing internal operations of the integrated circuit 200, i.e., are used for test and debugging purposes. In the current embodiment, the observability logic uses observability 30 pins 260. In one embodiment, 5 of the observability pins 260 are designated as input pins (or control pins), and 25 of the observability pins 260 are designated as output pins.

In one embodiment, the integrated circuit 200 may further comprise boundary scan logic and associated pins.

FIG. 2

Figure 2:
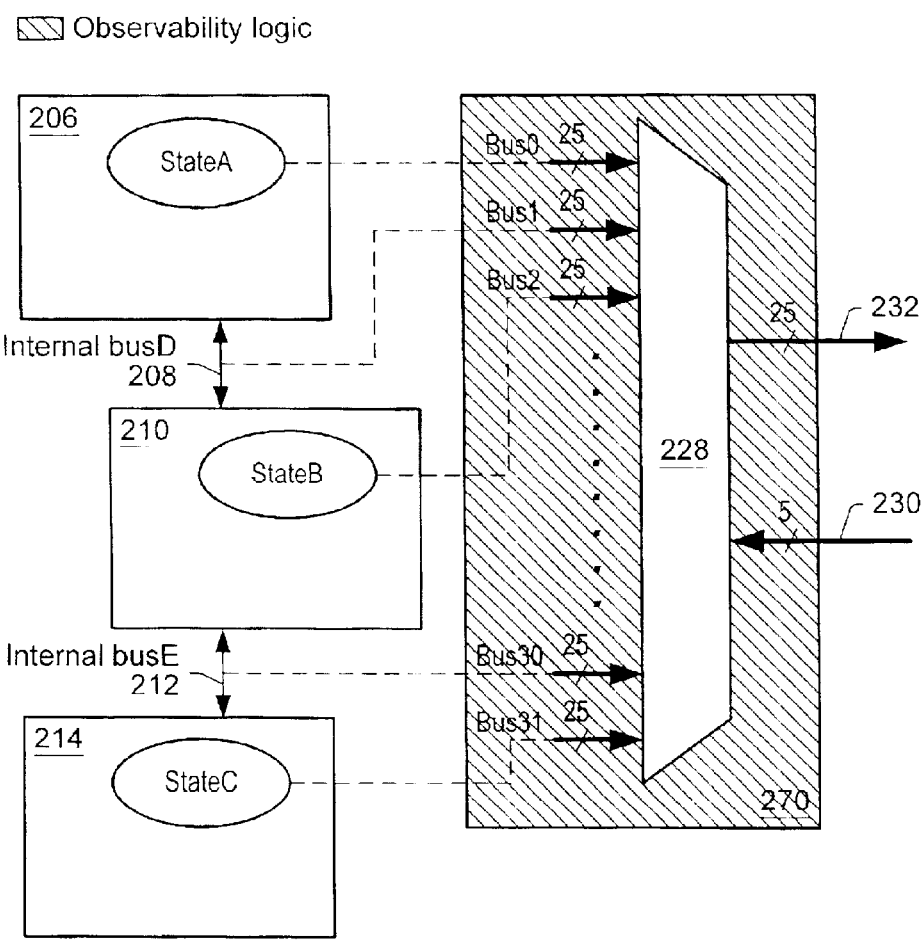
FIG. 2 is a block diagram of one embodiment of the observability logic interfacing to one or more functional units and/or internal buses of the integrated circuit.

FIG. 2 is a block diagram illustrating logic internal to the integrated circuit 200. As shown, the integrated circuit 200 may include a plurality of functional blocks or functional units 206, 210, and 214. Each of the functional units 206, 210, and 214 may include a respective state. For example, functional unit 206 may includes a state referred to as state A, functional unit 210 may have a state referred to as state B, and functional unit 214 may have a state referred to as state C. For example, the functional units 206, 210, and 214 may include state machine logic, wherein the respective state machine logic has a respective state at any given clock cycle. The functional units 206, 210, and 214 may be coupled by respective internal buses 208 and 212. Each internal bus 208 and 212 may comprise a plurality of parallel data lines operating at a single high frequency. The functional units 206, 210, and 214 and the respective internal buses 208 and 212 operate together to perform a function or operation of the integrated circuit 200. Stated another way, the functional units 206, 210, and 214 and internal buses 208 and 212 are not related to the testing operations and are not part of the observability logic.

FIG. 2 also shows one embodiment of the observability logic 270. As shown, the observability logic 270 may include selection logic, e.g., a multiplexer 228. The multiplexer 228 operates to select signals from one of the functional units 206, 210 or 214 and/or internal buses 208 or 212 and provide these signals as an output for observation. One or more of the observability pins 260 are inputs provided to select inputs of the multiplexer 228 to select which signals from which of the functional units 206, 210 or 214 and/or internal buses 208 or 212 are to be provided as outputs to the observability pins designated as outputs.

As shown in the embodiment of FIG. 2, the multiplexer 228 includes a plurality of inputs which are each coupled to either a respective functional unit (e.g., functional units 206, 210 or 214) or to an internal bus (e.g., internal buses 208 or 214). In the embodiment shown, the multiplexer 228 receives 32 inputs. In other words, the multiplexer 228 can receive signals from 32 different functional units and/or internal buses. A plurality of the observability pins 260 are assigned as output pins 232 and are coupled to an output of the multiplexer 228. In this embodiment, 25 output pins 232 are used, and thus the multiplexer 228 provides a 25 bit output. Accordingly, each of the 32 inputs to the multiplexer 228 has a width of 25 bits.

One or more of the observability pins 260 are assigned as input pins 230 and are used as select signals to the multiplexer 228. The input pins or control pins 230 provide a select signal to the multiplexer 228 to select which of the multiplexer's inputs, i.e., which of the functional unit states or internal bus signals, are provided as an output of the multiplexer 228 to the output pins 232. In the current embodiment, as noted above, 25 of the observability pins 260 are output pins 232 coupled to the output of the multiplexer 228, and 5 of the observability pins 260 are input pins 230 coupled to the select input of the multiplexer 228. As described above, the multiplexer 228 receives 32 25 bit inputs. The five control pins or input pins 230 are used to select among the 32 inputs and provide one of these respective 32 inputs as an output on the 25 output pins 232. The current embodiment provides visibility to an extra 800 internal signals, which is important for system debugging. In the embodiment shown in FIG. 2, bus0 is coupled to provide state A of functional unit 206;
bus1 is coupled to provide internal bus D 208;
bus2 is coupled to provide state B of functional unit 210;
bus30 is coupled to provide internal bus E 212; and
bus31 is coupled to provide state C of functional unit 214.

The observability logic 270 operates to dynamically and/or in real time display internal values of functional unit states or internal buses on the pins 232 of the integrated circuit 200 while the integrated circuit 200 or system is performing real applications. Signals from an internal bus or internal functional block are preferably provided in real time on the output pins 232, i.e., the signals are provided on the output pins 232 substantially as they are generated, without any intermediate storage or other delay. The observability pins thus operate to present the internal data in real time, which allows substantially immediate observation of changes in the system, not static values as when using boundary scan logic. Observation of changes to the integrated circuit using the test output pins 232 may be performed by a user, or may be analyzed by software executing on a computer system.

Additionally, in one embodiment the observability output pins 232 may be used as trigger states for a logic analyzer. In other words, a logic analyzer may monitor the observability output pins 232 (and the signal provided on the input pins 230) for signal values of a certain functional unit or internal bus, and may trigger capture of the state of one or more functional pins 250 of the integrated circuit 200 when these signal values are detected. This would allow the logic analyzer to capture a state of the input/output pins (functional pins) 250 with relation to the specific state of an internal state machine or internal bus of the integrated circuit 200. In addition, the logic analyzer may also perform the reverse operation, i.e., monitor certain of the functional pins 250 for signal values and trigger capture of the state of a certain functional unit or internal bus (by applying the appropriate signals to the control pins 230 and capturing the state of the observability output pins 232) when these signal values are detected.

In one embodiment, the input pins are static, and hence the timing of the select inputs to the multiplexer 228 is not critical. This allows for the observability logic 270 to be small and easily designed.

Various other embodiments of the present invention are contemplated. For example, embodiments of the present invention contemplate a greater number of multiplexer inputs, a greater number of multiplexer outputs, a greater number of multiplexers, etc. In addition, based on the needs of the design, the same number of observability pins can be used to expose more internal data. Alternatively, wider buses could be used, with less data displayed externally.

For example, with 30 observability pins, six pins can be assigned as input pins for multiplexer selects and 24 pins used for observed output signals. This provides the user with $2^6$ or 64 different 24-bit buses (1536 internal signals). With 30 observability pins, the number of observed signals can be described as:

$2^{input}*(30-input)$, where 0<input<30.

The design can be generalized as to a number n of observability pins where the number of observed internal signals can be derived as follows:

$2^{input}*(n-input)$, where 0<input<n.

FIG. 3

Figure 3:
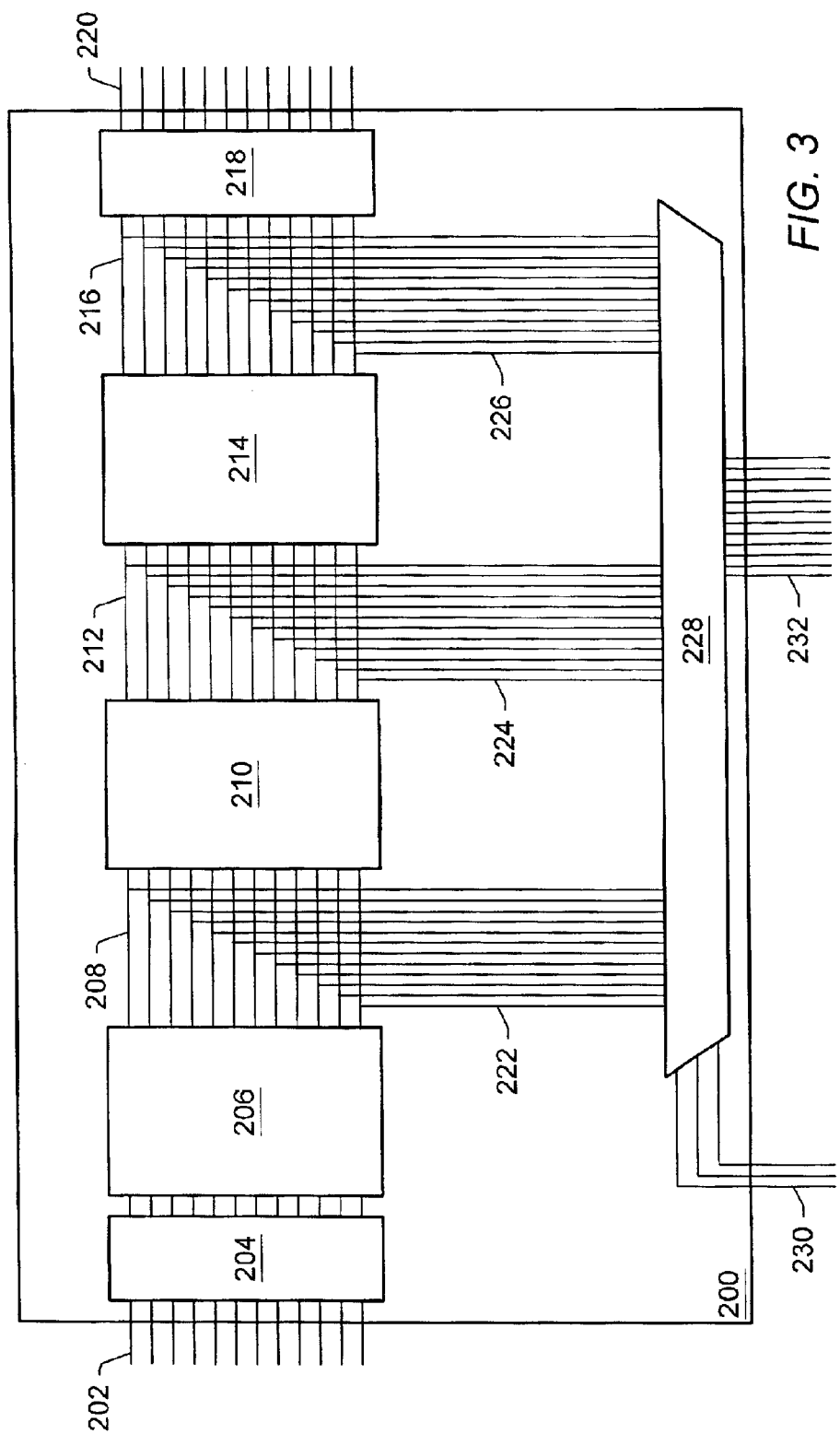
FIG. 3 is a block diagram a system for testing integrated circuits according to one embodiment of the present invention.

FIG. 3 is a block diagram of a system for testing an integrated circuit according to one embodiment of the present invention. In this embodiment, integrated circuit 200 comprises a plurality of functional units or blocks 204, 206, 210, 214, and 218. These functional units are connected via internal buses 208, 212, and 216. In this example, functional units 204 and 220 are input/output (I/O) blocks and are connected to I/O pins 202 and 220, respectively. Under normal operation of integrated circuit 200, data is received on input pins 202 and routed to input block 204. The data may then be forwarded to one or more of the other functional blocks 206, 210, and/or 214 for processing.

In order to effectively test integrated circuit 200, it is desirable to monitor the information that is conveyed on internal buses 208, 212, and 216 while integrated circuit 200 is operating. To accomplish this, buses 208, 212, and 216 are extended (as shown by 222, 224, and 226, respectively) to connect with selection logic or multiplexer 228. Selection logic 228 is in turn connected to test pins 232. Selection logic 228 is controlled by signals from control pins 230.

To enable testing, control pins 230 may be driven by control signals that cause selection logic 228 to select one of internal buses 208, 212, or 216. The signals on the selected bus are then conveyed by selection logic 228 to output test pins 232. While each implementation may vary, in one embodiment only a subset of the signal lines that form internal buses 208, 212, or 216 may be connected to selection logic 228 in order to reduce the number of output pins 232 (for integrated circuit packages with limited numbers of pins). For example, only selected data lines from internal bus 208 may be forwarded to test pins 232, with control signals (e.g., a parity line) from internal bus 208 not being forwarded.

In some embodiments, die space for integrated circuit 200 may be in short supply. In these implementations, it may particularly useful to implement selection logic 228 using smaller transistors, i.e., transistors smaller than those used in the remainder of the integrated circuit 200. Since smaller transistors are typically not able to switch states as quickly as larger transistors, selection logic 228 may be configured to be switched in a non-real time manner (i.e., offline). This potential limitation in switching speed is due to the smaller transistor's more limited ability to sink or source current without excessive heat build up damaging the transistor.

In some embodiments, the control signals driving control pins 230 may be generated using an automated testing program, such as an automated test executive (ATE) program. The testing program may be executed on a computer system that is also connected to test pins 232. The automated testing program may be configured to select a particular internal bus (or functional unit state) for monitoring and then capture the signals from that internal bus (or functional unit state) using test pins 232. The values of the signals captured on the I/O pins or functional pins 250 may be used to trigger a capture of signals on the test pins 232 for a particular functional unit or internal bus, and vice versa.

Figure 4:
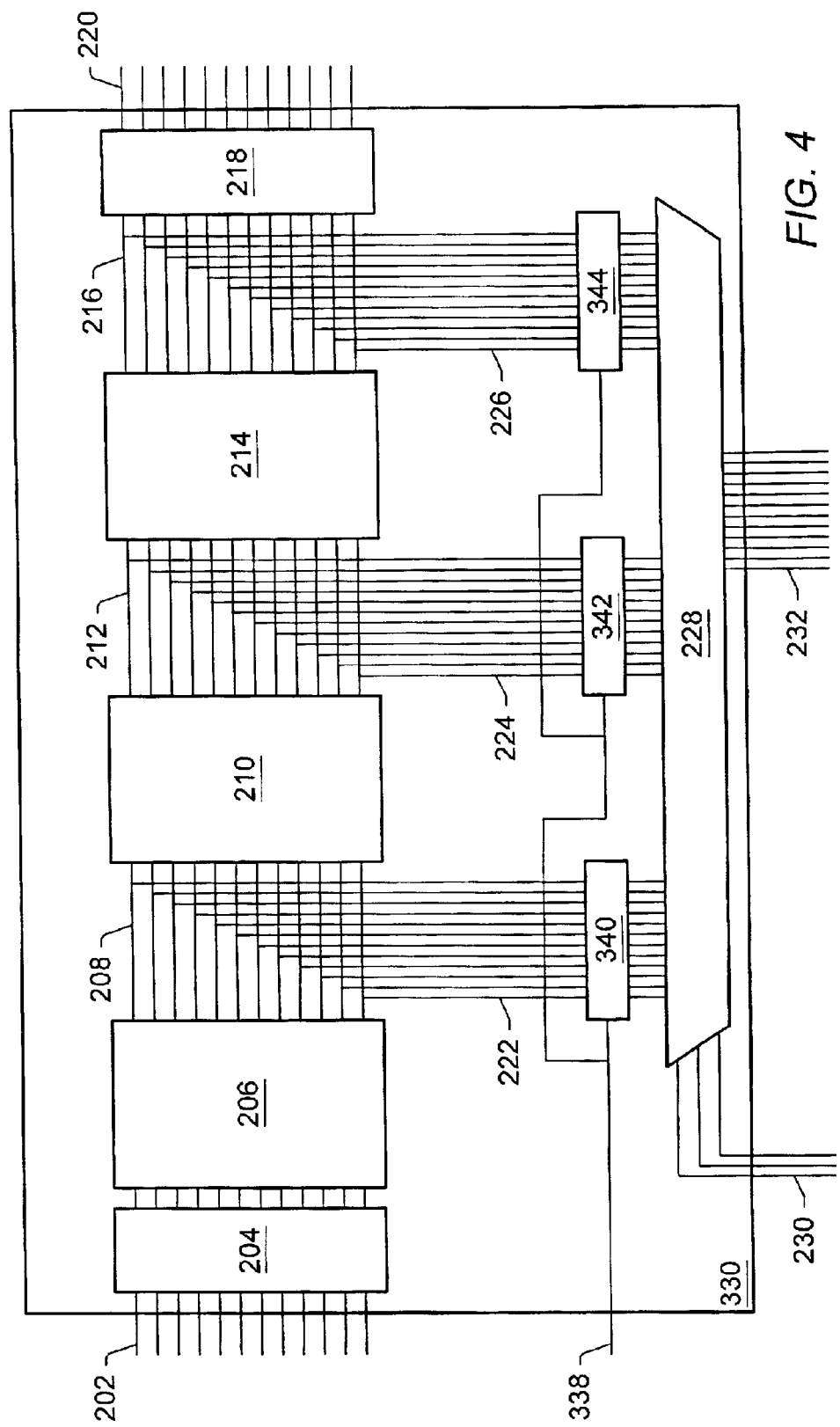
FIG. 4 is a block diagram a system for testing integrated circuits according to another embodiment of the present invention.

In some embodiments, once integrated circuit 200 has been determined to be operating properly (i.e., testing is passed and debugging is complete), control pins 230 and test pins 232 may be configured into a low power state when integrated circuit 200 is actually used in a production system. For example, depending on the exact implementation, control pins 230 may be tied to ground or Vcc (e.g., using a pull-up or pull-down resistor) to reduce any potential stasis current that would otherwise cause unnecessary power consumption and heat generation in integrated circuit 200. In other embodiments, control pins 230 and/or test pins 232 may simply be allowed to float. In another embodiment, control pins 230 may be specified to be a certain value in production use, and thus multiplexer 228 may be configured to always provide a selected functional unit state or internal bus as an output. In another embodiment, control pins 230 and/or test pins 232 may be selectively connected, multiplexed, or otherwise configured to connect to other desired input/output signals of the integrated circuit, as shown in FIG. 4. Alternatively, in other implementations, if integrated circuit 200 is determined to pass testing and debugging, a final production version of integrated circuit may be manufactured without selection logic 228, control pins 230, and test pins 232. Advantageously, this may allow the use of a smaller integrated circuit package (i.e., with lower pin count).

Figure 5:
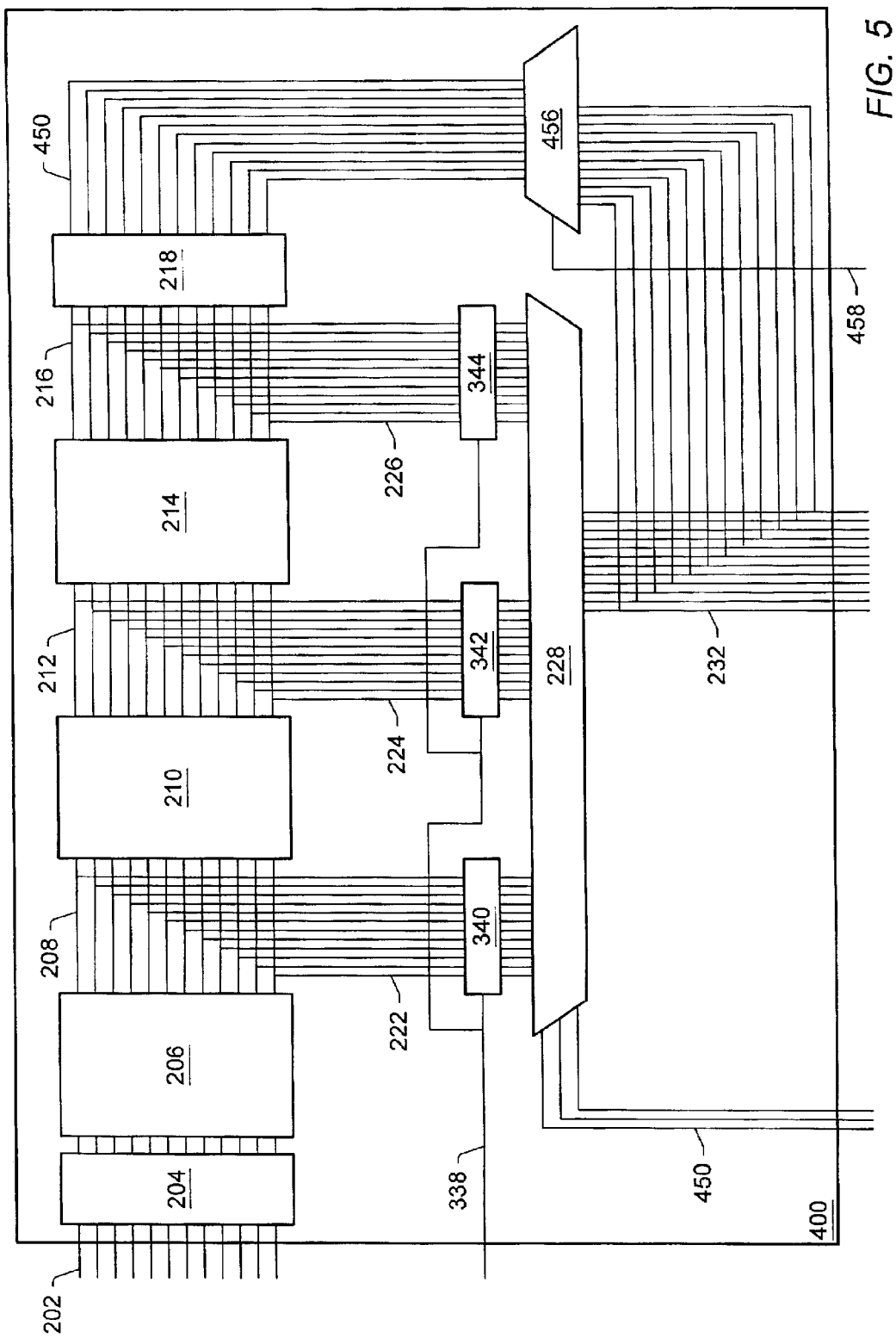
FIG. 5 is a block diagram a system for testing integrated circuits according to yet another embodiment of the present invention.

FIGS. 4 and 5

FIG. 4 is a block diagram of a system for testing an integrated circuit according to another embodiment of the present invention. In the embodiment of FIG. 4, interface logic or output buffers 340, 342 and 344 are coupled to receive the various internal bus signals before they are provided as inputs to the multiplexer 228. These output buffers 340, 342 and 344 each receive a clock or enable signal 338. This operates to synchronize the output of the selection logic or multiplexer 228, as desired. The interface logic or output buffers 340, 342 and 344 may comprise buffers, first-in first-out (FIFO) memories, or flip-flops.

FIG. 5 is a block diagram of a system for testing an integrated circuit according to another embodiment of the present invention. In the embodiment of FIG. 5, input/output signals 450, which would normally be provided on functional pins of the integrated circuit, are instead connected through an enable buffer 456 to the test or output pins 232. Input pin 458 may provide an enable signal to the enable buffer 456. Thus, when testing is complete, the enable buffer 456 may be enabled to provide the output signals 450 as outputs on the test pins 232. Thus the test pins 232 may effectively "double" as output pins (functional pins) in this embodiment.

A method for testing integrated circuits according to one embodiment of the present invention is also contemplated. In one embodiment, the method includes providing one or more control signals to the observability input or control pins 230 on the integrated circuit 200 being tested. The control signal or signals cause the selection logic 228 within the integrated circuit 200 to select one of a plurality of internal buses and/or functional units for output to the set of parallel output test pins 232 on the integrated circuit 200. The states of the various I/O pins of the integrated circuit 200 may also be monitored. As described above, a logic analyzer or similar hardware and/or software may operate to monitor states of the test pins 232 and use detected states of these pins 232 to trigger capture of the states of certain I/O pins (functional pins) 250. In a similar manner, a logic analyzer or similar hardware and/or software may operate to monitor states of various ones of the functional pins 250 and use detected states of these pins 250 to trigger generation of certain control signals and corresponding capture of the state of the test pins 232, or trigger capture of other functional pins 250. Automated test software may be configured to perform various types of tests and signal captures using the observability logic described herein.

Software for automatically determining the size of multiplexing logic, including number of mux inputs, size of mux inputs, etc. to allow a particular set of internal buses and/or states to be individually monitored is also contemplated. For example, a computer program may comprise instructions executable to 1) receive user-specified information regarding which of a plurality of internal buses on an integrated circuit are to be made available for testing purposes; 2) calculate a size of selection logic and number of control signals required to selectively convey the information on the internal buses to a set of test pins; and 3) provide the results of the calculations to an automated place-and-route routine that determines the physical layout of the integrated circuit. The computer program instructions may be further executable to programmatically generate a specification for the selection logic (e.g., VHDL) based on the user-specified information.

Figure 6:
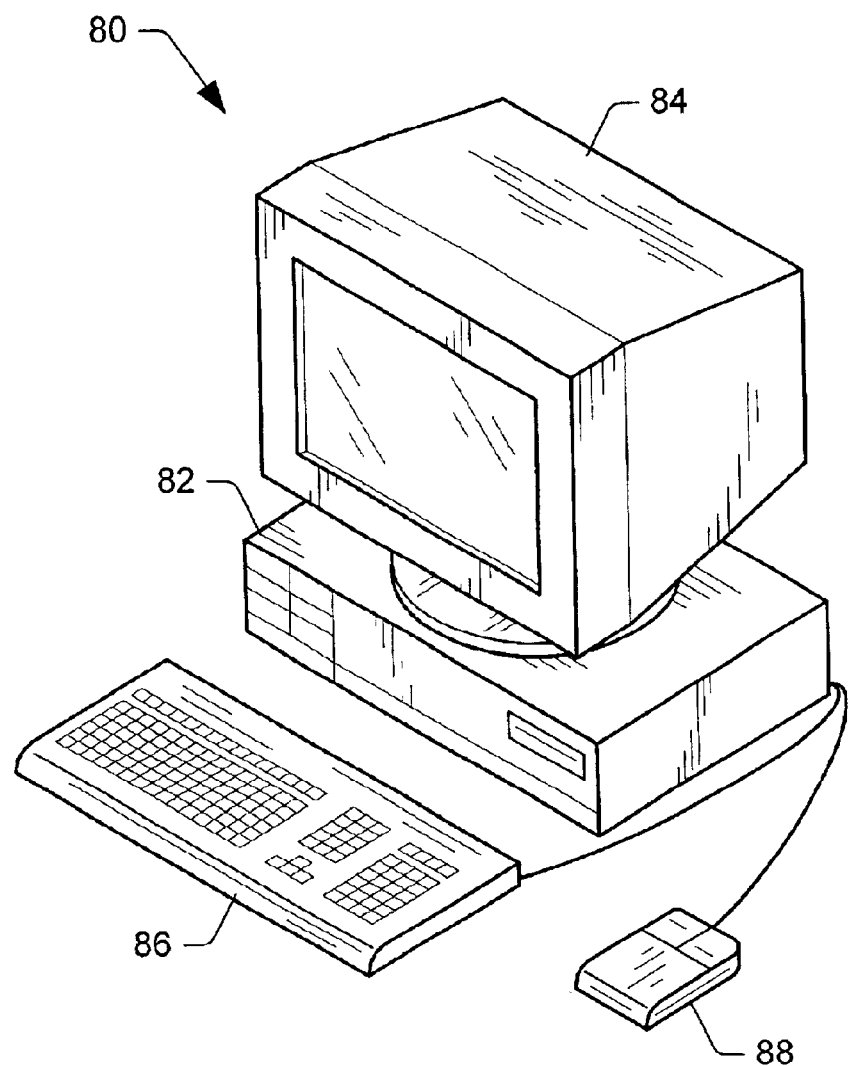
FIG. 6 illustrates one embodiment of a computer system capable of performing automated testing of integrated circuits.

FIG. 6 illustrates one embodiment of a computer system 80 capable of performing automated testing of integrated circuits. The computer system 80 may execute automated test software and may interface with the integrated circuit 200, and more particularly with the observability logic 270 comprised in the integrated circuit 200, to conduct various desired tests on the integrated circuit.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications.

What is claimed is:

1. An integrated circuit including logic for testing internal operation of the integrated circuit, the integrated circuit comprising:

a plurality of internal functional blocks coupled by a plurality of internal buses, wherein the plurality of internal functional blocks and the plurality of internal buses are comprised in the integrated circuit;

a set of test control input pins comprised on the integrated circuit;

a set of test output pins comprised on the integrated circuit; and selection logic comprised in the integrated circuit, wherein the selection logic comprises:
      a plurality of inputs coupled to two or more of the plurality of internal buses;
      at least one select input coupled to receive select signals from the set of test control input pins; and
      an output coupled to the set of test output pins;

wherein the selection logic is operable to select internal bus signals from one of the two or more internal buses based on the select signals from the test control input pins, wherein the selection logic is configured to output the selected internal bus signals to the set of test output pins;

interface logic coupled between at least one of the plurality of inputs of the selection logic and at least one of the plurality of internal buses, wherein the interface logic is configured to buffer data from the at least one internal bus before the data is output to the set of test output pins.

2. The integrated circuit of claim 1,
wherein the selection logic further comprises a plurality of inputs coupled to two or more of the plurality of internal functional blocks;
wherein the selection logic is operable to select functional block signals from one of the two or more internal functional blocks based on the select signals from the test control input pins, wherein the selection logic is configured to output the selected functional block signals to the set of test output pins.

3. The integrated circuit of claim 1,
wherein a first internal functional block is operable to provide first internal functional block output signals, wherein the first internal functional block output signals are operable to be selectively coupled to the output of the selection logic.

4. The integrated circuit of claim 1, wherein each internal bus comprises a plurality of parallel data lines operating at a single high frequency.

5. The integrated circuit of claim 1, wherein data from a selected internal bus is output in parallel via the set of test output pins at a frequency equal to the operating frequency of the selected internal bus.

6. The integrated circuit of claim 1, wherein the selection logic comprises at least one multiplexer.

7. The integrated circuit of claim 1, wherein the integrated circuit is an application specific integrated circuit.

8. The integrated circuit of claim 1, wherein the selection logic is configured to select and output the selected internal bus signals to the set of test output pins in real time.

9. An integrated circuit including logic for testing internal operation of the integrated circuit, the integrated circuit comprising:
a plurality of internal functional blocks coupled by a plurality of internal buses, wherein the plurality of internal functional blacks and the plurality of internal buses are comprised in the integrated circuit;
at least one test control input pin comprised on the integrated circuit;
a set of test output pins comprised on the integrated circuit; and
selection logic comprised in the integrated circuit, wherein the selection logic comprises:
a plurality of inputs coupled to two or more of the plurality of internal buses;
at least one select input coupled to receive at least one select signal from the at least one test control input pin; and
an output coupled to the set of test output pins;
wherein the selection logic is operable to select internal bus signals from one of the two or more internal buses based on the at least one select signal from the at least one test control input pin, wherein the selection logic is configured to output the selected internal bus signals to the set of test output pins;
interface logic coupled between at least one of the plurality of inputs of the selection logic and at least one of the plurality of internal buses, wherein the interface logic is configured to buffer data from the at least one internal bus before the data is output to the set of test output pins.

10. An integrated circuit including logic for testing internal operation of the integrated circuit, the integrated circuit comprising:
a plurality of internal functional blocks coupled by a plurality of internal buses, wherein the plurality of internal functional blocks and the plurality of internal buses are comprised in the integrated circuit;
at least one test control input pin comprised on the integrated circuit;
a set of test output pins comprised on the integrated circuit; and
selection logic comprised in the integrated circuit, wherein the selection logic comprises:
a plurality of inputs coupled to two or more of the plurality of internal functional blocks;
at least one select input coupled to receive at least one select signal from the at least one test control input pin; and
an output coupled to the set of test output pins;
wherein the selection logic is operable to select internal functional block signals from one of the two or more internal functional blocks based on the at least one select signal from the at least one test control input pin, wherein the selection logic is configured to output the selected internal functional block signals to the set of test output pins;
interface logic coupled between at least one of the plurality of inputs of the selection logic and at least one of the plurality of internal buses, wherein the interface logic is configured to buffer data from the at least one internal bus before the data is output to the set of test output pins.

11. An application specific integrated circuit, comprising:
a plurality of functional units;
a plurality of internal buses connecting the functional units;
one or more control pins;
a plurality of test pins; and
multiplexing logic coupled to at least a subset of the plurality of internal buses and to the test pins, wherein the multiplexing logic is configured to select one of the plurality of internal buses in response to one or more control signals conveyed to the multiplexing logic from the control pins, wherein the multiplexing logic is configured to output signals from the selected internal bus to the test pins in real-time;
wherein the multiplexing logic is configured to select one of the plurality of functional units in response to the one or more control signals conveyed to the multiplexing logic from the control pins, wherein the multiplexing logic is configured to output signals from the selected functional unit to the test pins in real-time;
the application specific integrated circuit further comprising interface logic configured to interface between the selected internal bus operating at a first clock rate, and the output pins operating at a second clock rate.

12. The application specific integrated circuit of claim 11, wherein one of the internal buses is an output bus, and wherein the test pins also operate as output pins.

13. An integrated circuit including logic for testing internal operation of the integrated circuit, the integrated circuit comprising:
a plurality of internal functional blocks coupled by a plurality of internal buses, wherein the plurality of internal functional blocks and the plurality of internal buses are comprised in the integrated circuit;
a set of test control input pins comprised on the integrated circuit;
a set of test output pins comprised on the integrated circuit; and selection logic comprised in the integrated circuit, wherein the selection logic comprises:
  a plurality of inputs coupled to two or more of the plurality of internal buses;
  at least one select input coupled to receive select signals from the set of test control input pins; and
  an output coupled to the set of test output pins;
wherein the selection logic is operable to select internal bus signals from one of the two or more internal buses based on the select signals from the test control input pins, wherein the selection logic is configured to output the selected internal bus signals to the set of test output pins;
wherein the integrated circuit further comprises boundary scan logic and pins.

14. An integrated circuit including logic for testing internal operation of the integrated circuit, the integrated circuit comprising:
  a plurality of internal functional blocks coupled by a plurality of internal buses, wherein the plurality of internal functional blocks and the plurality of internal buses are comprised in the integrated circuit;
  a set of test control input pins comprised on the integrated circuit;
  a set of test output pins comprised on the integrated circuit; and
  selection logic comprised in the integrated circuit, wherein the selection logic comprises:
    a plurality of inputs coupled to two or more of the plurality of internal buses;
    at least one select input coupled to receive select signals from the set of test control input pins; and
    an output coupled to the set of test output pins;
  wherein the selection logic is operable to select internal bus signals from one of the two or more internal buses based on the select signals from the test control input pins, wherein the selection logic is configured to output the selected internal bus signals to the set of test output pins;
  wherein the selection logic is implemented using small transistor sizes that are limited to switching at a significantly slower clock frequencies than the functional blocks.

15. An application specific integrated circuit, comprising:
  a plurality of functional units;
  a plurality of internal buses connecting the functional units;
  one or more control pins;
  a plurality of test pins; and
  multiplexing logic coupled to at least a subset of the plurality of internal buses and the test pins, wherein the multiplexing logic is configured to select one of the plurality of internal buses in response to one or more control signals conveyed to the multiplexing logic from the control pins, wherein the multiplexing logic is configured to output signals from the selected internal bus to the test pins in real-time;
  wherein the test pins are configurable for non-test use by a control signal delivered to the selection logic via the one or more control pins.

* * * * *

UNITED STATES PATENT AND TRADEMARK OFFICE
CERTIFICATE OF CORRECTION

PATENT NO. : 6,781,406 B2 Page 1 of 1
DATED : August 24, 2004
INVENTOR(S) : Emberling et al.

It is certified that error appears in the above-identified patent and that said Letters Patent is hereby corrected as shown below:

Column 9,
Line 36, please delete "internal functional blacks and the plurality of internal" and substitute -- internal functional blocks and the plurality of internal --.

Signed and Sealed this

Seventh Day of December, 2004

JON W. DUDAS
*Director of the United States Patent and Trademark Office*